United States Patent
Ishizawa et al.

(10) Patent No.: US 9,490,046 B2
(45) Date of Patent: Nov. 8, 2016

(54) CONDUCTIVE MATERIAL AND CONNECTED STRUCTURE

(71) Applicant: SEKISUI CHEMICAL CO., LTD., Osaka, Osaka (JP)

(72) Inventors: Hideaki Ishizawa, Kouka (JP); Takashi Kubota, Kouka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/891,615

(22) PCT Filed: May 20, 2014

(86) PCT No.: PCT/JP2014/063290
§ 371 (c)(1),
(2) Date: Nov. 16, 2015

(87) PCT Pub. No.: WO2014/189028
PCT Pub. Date: Nov. 27, 2014

(65) Prior Publication Data
US 2016/0086687 A1    Mar. 24, 2016

(30) Foreign Application Priority Data
May 23, 2013 (JP) .................... 2013-109137

(51) Int. Cl.
*H01B 1/22* (2006.01)
*H05K 1/09* (2006.01)
(Continued)

(52) U.S. Cl.
CPC .............. *H01B 1/22* (2013.01); *B22F 1/025* (2013.01); *C08J 3/128* (2013.01); *C08L 63/00* (2013.01); *C08L 101/02* (2013.01); *H01L 24/80* (2013.01); *H05K 1/09* (2013.01); *H05K 3/323* (2013.01);
(Continued)

(58) Field of Classification Search
CPC ... H01B 1/22; H05K 1/09; H05K 2201/0221
USPC .......................................... 174/262; 252/500
See application file for complete search history.

(56) References Cited

U.S. PATENT DOCUMENTS 5,215,601 A    6/1993  Gomi et al.
5,907,007 A    5/1999  Ito et al.
(Continued)

FOREIGN PATENT DOCUMENTS

JP    5-92296 A    4/1993
JP    9-253884 A    9/1997
(Continued)

OTHER PUBLICATIONS

Written Opinion of the International Searching Authority (PCT/ISA/237) for Application No. PCT/JP2014/063290 mailed Aug. 5, 2014 (English Translation mailed Dec. 3, 2015).
(Continued)

*Primary Examiner* — Timothy Thompson
*Assistant Examiner* — Charles Pizzuto
(74) *Attorney, Agent, or Firm* — Cheng Law Group, PLLC

(57) ABSTRACT

There is provided a conductive material which has a rapid reaction rate and is high in fluxing effect. The conductive material according to the present invention includes a conductive particle having solder at at least an external surface, an anionically hardenable compound, an anionic hardener, and an organic acid having a carboxyl group and having a functional group that is an esterified carboxyl group.

11 Claims, 3 Drawing Sheets

(51) Int. Cl.

| | | |
|---|---|---|
| *C08L 63/00* | (2006.01) | |
| *C08L 101/02* | (2006.01) | |
| *H01L 23/00* | (2006.01) | |
| *H05K 3/34* | (2006.01) | |
| *H05K 3/32* | (2006.01) | |
| *C08J 3/12* | (2006.01) | |
| *B22F 1/02* | (2006.01) | |
| *H05K 3/36* | (2006.01) | |
| *B22F 1/00* | (2006.01) | |

(52) U.S. Cl.
CPC ........... *H05K 3/3457* (2013.01); *B22F 1/0062* (2013.01); *B22F 1/02* (2013.01); *H01L 2924/01322* (2013.01); *H01L 2924/15788* (2013.01); *H05K 3/3436* (2013.01); *H05K 3/363* (2013.01); *H05K 2201/0221* (2013.01)

(56) References Cited

U.S. PATENT DOCUMENTS 6,488,781 B1   12/2002   Tanahashi et al.

2005/0151235 A1 *  7/2005   Yokoi
2013/0340806 A1    12/2013  Sukata et al.

FOREIGN PATENT DOCUMENTS

| JP | 2000-61689 A | 2/2000 |
|---|---|---|
| JP | 2003-225795 A | 8/2003 |
| JP | 2006-199937 A | 8/2006 |
| JP | 2008-12576 A | 1/2008 |
| JP | 2009-242716 A | 10/2009 |
| JP | 2009-263499 A | 11/2009 |
| JP | 2009-263500 A | 11/2009 |
| JP | 2011-16967 A | 1/2011 |
| JP | 2012-216770 A | 11/2012 |
| WO | WO-2006/064849 A1 | 6/2006 |
| WO | WO-2012/102079 A1 | 8/2012 |

OTHER PUBLICATIONS

International Search Report for the Application No, PCT/JP2014/063290 mailed Aug. 5, 2014.

Written Opinion of the international Searching Authority (PCT/ISA/237) for Application No. PCT/JP2014/063290 mailed Aug. 5, 2014.

* cited by examiner

21

US 9,490,046 B2

CONDUCTIVE MATERIAL AND CONNECTED STRUCTURE

TECHNICAL FIELD

The present invention relates to a conductive material containing conductive particles, and for example, relates to a conductive material which is capable of being used for electrically connecting electrodes disposed on various connection object members such as a flexible printed circuit board, a glass substrate, a glass epoxy board and a semiconductor chip. Moreover, the present invention relates to a connected structure prepared with the above-mentioned conductive material.

BACKGROUND ART

A pasty or film-shaped anisotropic conductive material has been widely known. In the anisotropic conductive material, a plurality of conductive particles is dispersed in a binder resin.

In order to obtain various kinds of connected structures, the above-mentioned anisotropic conductive material is used for the connection of a flexible printed circuit board and a glass substrate (FOG (Film on Glass)), the connection of a semiconductor chip and a flexible printed circuit board (COF (Chip on Film)), the connection of a semiconductor chip and a glass substrate (COG (Chip on Glass)), the connection of a flexible printed circuit board and a glass epoxy board (FOB (Film on Board)), and the like.

As an example of the above-mentioned anisotropic conductive material, in the following Patent Document 1, a conductive adhesive containing an epoxy-based adhesive having a fluxing action and SnBi-based solder powder has been disclosed. In Patent Document 1, it has been described that the content of the solder powder suitably lies within the range of 10 to 90% by weight, preferably 40 to 80% by weight, relative to 100% by weight of the conductive adhesive. Moreover, in Patent Document 1, the epoxy-based adhesive having a fluxing action is exemplified by an epoxy-based adhesive containing an epoxy resin, a hardener and an organic acid. Moreover, in Patent Document 1, it has been described that the conductive adhesive is usable even if a small amount of succinic acid, malonic acid, glutaric acid, adipic acid, suberic acid, azelaic acid, sebacic acid, or the like is added as an auxiliary activator. Moreover, in the Example of Patent Document 1, as the above-mentioned organic acid and the above-mentioned auxiliary activators, 2,5-diethyladipic acid, succinic acid, glutaric acid, and malonic acid are used.

In the following Patent Document 2, a solder paste containing flux and solder particles has been disclosed. The above-mentioned flux contains a silicone resin and an organic acid or an organic acid salt. In Patent Document 2, with regard to the quantitative ratio between the flux and the solder particles, it has been described that the content of the flux suitably lies within the range of 5 to 60 parts by weight relative to the content of the solder particles of 40 to 95 parts by weight. In the Example of Patent Document 2, as the organic acid or the organic acid salt, malonic acid, succinic acid, glutaric acid, adipic acid, azelaic acid, sebacic acid, hydroxyacetic acid, or monoethanolamine succinate is used.

On the other hand, in the following Patent Document 3, flux for soldering which contains an activator obtained from a dibasic acid with a molecular weight less than or equal to 250 and a monobasic acid with a molecular weight greater than or equal to 150 and less than or equal to 300 has been disclosed.

In the following Patent Document 4, a solder paste which contains an alcohol having at least two or more OH groups as a base agent for flux, contains an organic acid as an activator for flux, and contains metal powder has been disclosed.

RELATED ART DOCUMENT

Patent Document

Patent Document 1: JP 2006-199937 A
Patent Document 2: JP 05-92296 A
Patent Document 3: JP 09-253884 A
Patent Document 4: JP 2000-61689 A

SUMMARY OF THE INVENTION

Problems to be Solved by the Invention

In such conventional anisotropic conductive materials described in Patent Documents 1 and 2, it is difficult to achieve both excellent reaction rate and excellent fluxing effect at a high level. In particular, depending on the kind of a hardener to be used, there is a case where the reaction rate is slow.

An object of the present invention is to provide a conductive material which has a rapid reaction rate and is high in fluxing effect, and to provide a connected structure prepared with the conductive material.

An object of the present invention with limitation is to provide a conductive material which is capable of reducing the connection resistance in the case where electrodes are electrically connected since the conductive material is high in fluxing effect, and to provide a connected structure prepared with the conductive material.

Means for Solving the Problems

According to a broad aspect of the present invention, there is provided a conductive material including conductive particles having solder at at least an external surface, an anionically hardenable compound, an anionic hardener, and an organic acid having a carboxyl group and having a functional group that is an esterified carboxyl group.

In a specific aspect of the conductive material according to the present invention, the organic acid having a carboxyl group and having a functional group that is an esterified carboxyl group is obtained by esterifying a part of carboxyl groups in an organic acid having a plurality of carboxyl groups.

In a specific aspect of the conductive material according to the present invention, the organic acid having a carboxyl group and having a functional group that is an esterified carboxyl group is obtained by allowing an organic acid having a plurality of carboxyl groups and an alcohol to react with each other so that a part of carboxyl groups is esterified.

In a specific aspect of the conductive material according to the present invention, the conductive material further includes an esterified substance obtained by esterifying all of carboxyl groups in an organic acid having a plurality of carboxyl groups.

In a specific aspect of the conductive material according to the present invention, the conductive material further includes an organic acid having a plurality of carboxyl groups but having no functional group that is an esterified carboxyl group.

In a specific aspect of the conductive material according to the present invention, the conductive material further includes an esterified substance obtained by esterifying all of carboxyl groups in an organic acid having a plurality of carboxyl groups, and an organic acid having a plurality of carboxyl groups but having no functional group that is an esterified carboxyl group.

In a specific aspect of the conductive material according to the present invention, the proportion of the functional group that is an esterified carboxyl group is greater than or equal to 10% and less than or equal to 80%, relative to 100% of the whole number of carboxyl groups and functional groups that are esterified carboxyl groups, in the total of the organic acid having a carboxyl group and having a functional group that is an esterified carboxyl group, the esterified substance obtained by esterifying all of carboxyl groups in an organic acid having a plurality of carboxyl groups, and the organic acid having a plurality of carboxyl groups but having no functional group that is an esterified carboxyl group.

In a specific aspect of the conductive material according to the present invention, the acid value is greater than or equal to 50 mgKOH/g and less than or equal to 370 mgKOH/g.

In a specific aspect of the conductive material according to the present invention, the organic acid having a carboxyl group and having a functional group that is an esterified carboxyl group has one carboxyl group.

In a specific aspect of the conductive material according to the present invention, the conductive material is a circuit connecting material used for the electrical connection between electrodes.

According to a broad aspect of the present invention, there is provided a connected structure including a first connection object member having a first electrode on its surface, a second connection object member having a second electrode on its surface, and a connection part connecting the first connection object member and the second connection object member, wherein the connection part is formed of the conductive material described above, and the first electrode and the second electrode are electrically connected by the conductive particle.

Effect of the Invention

Since the conductive material according to the present invention includes conductive particles having solder at at least an external surface, an anionically hardenable compound, an anionic hardener, and an organic acid having a carboxyl group and having a functional group that is an esterified carboxyl group, it is possible to increase the reaction rate and to heighten the fluxing effect in spite of including an anionically hardenable compound.

MODE(S) FOR CARRYING OUT THE INVENTION

Figure 1:
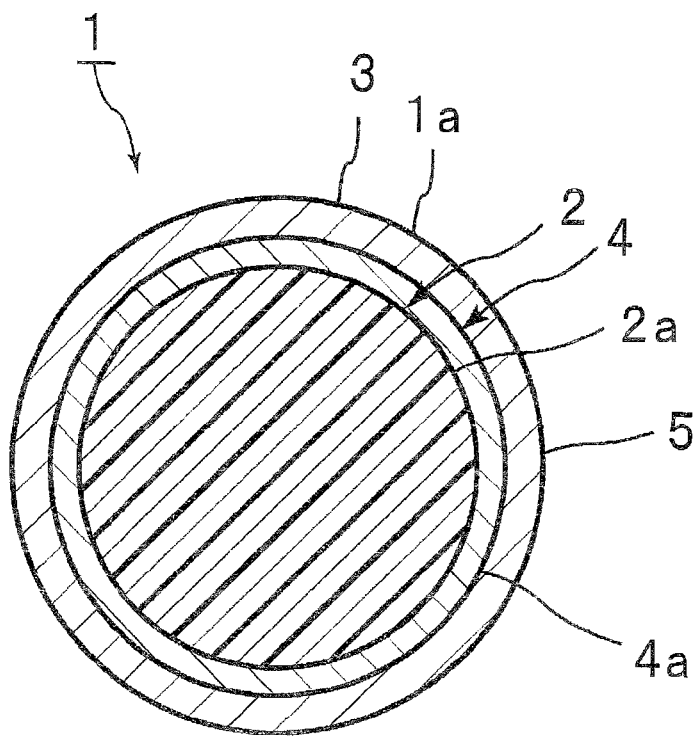
FIG. 1 is a cross-sectional view schematically showing a conductive particle contained in the conductive material in accordance with one embodiment of the present invention.

Hereinafter, the details of the present invention will be described.

The conductive material according to the present invention includes conductive particles having solder at at least an external surface, an anionically hardenable compound, an anionic hardener, and an organic acid (hereinafter, sometimes referred to as an organic acid A) having a carboxyl group and having a functional group that is an esterified carboxyl group.

When an anionic hardener and an organic acid having a plurality of carboxyl groups are combinedly used, there is a tendency that the carboxylic acid inhibits the anionic hardening reaction. As such, the reaction rate is slow. On the other hand, in the case where an organic acid having a carboxyl group is not used, a sufficient fluxing effect is not attained. For example, an oxide film on the surface of an electrode is not thoroughly removed.

By adopting the above-stated composition in the present invention, it is possible to increase the reaction rate and to heighten the fluxing effect in spite of including an anionically hardenable compound. In particular, by using the organic acid (the above-mentioned organic acid A) obtained by esterifying a part of carboxyl groups in an organic acid having a plurality of carboxyl groups, it is possible to achieve both excellent reaction rate and excellent fluxing effect at a high level. The use of the above-mentioned organic acid A greatly contributes to effectively excluding an oxide film on the solder constituting the external surface of a conductive particle or on the surface of an electrode. Moreover, the above-mentioned esterification greatly contributes to increasing the reaction rate in the case where an anionic hardener is used.

Moreover, by adopting the above-stated composition in the present invention, it is also possible to heighten the adhesive force between a hardened product of the conductive material and an adhesion object to which the hardened product is allowed to adhere.

The acid value of the above-mentioned conductive material is preferably greater than or equal to 50 mgKOH/g, more preferably greater than or equal to 100 mgKOH/g, preferably less than or equal to 370 mgKOH/g, more preferably less than or equal to 350 mgKOH/g, and further preferably less than or equal to 300 mgKOH/g. When the above-mentioned acid value is greater than or equal to the above lower limit and less than or equal to the above upper limit, it is possible to achieve both excellent reaction rate and excellent fluxing effect at a higher level.

It is preferred that the conductive material according to the present invention be a conductive material hardenable by heating. In this case, by the heat evolved at the time of allowing a conductive material to be hardened by heating, the solder constituting the external surface of the above-mentioned conductive particle can be melted. The conductive material according to the present invention may be a conductive material hardenable by both the irradiation of light and heating. In this case, a conductive material is semi-hardened (allowed to be at the B-stage) by the irradiation of light to decrease the fluidity of the conductive material, after which the conductive material can be hardened by heating.

Hereinafter, first, respective components contained in the conductive material according to the present invention and respective components preferably contained therein will be described in detail.

(Anionically Hardenable Compound)

The above-mentioned anionically hardenable compound is not particularly limited as long as the anionically hardenable compound is hardenable by the action of an anionic hardener. One kind of the above-mentioned anionically hardenable compound may be used alone, and two or more kinds thereof may be combinedly used.

The above-mentioned anionically hardenable compound is not particularly limited, and examples thereof include a hardenable compound having an unsaturated double bond, a hardenable compound having an epoxy group, and the like.

Examples of the above-mentioned hardenable compound having an unsaturated double bond include a hardenable compound having a vinyl group or a (meth)acryloyl group, and the like. From the viewpoints of easily controlling the hardening of the above-mentioned conductive material and still further enhancing the conduction reliability in a connected structure, it is preferred that the above-mentioned hardenable compound having an unsaturated double bond be a hardenable compound having a (meth)acryloyl group. By using the above-mentioned hardenable compound having a (meth)acryloyl group, controlling the hardening ratio in the whole conductive material allowed to be at the B-stage within a suitable range is facilitated, and the conduction reliability in the resulting connected structure is more enhanced.

From the viewpoints of easily controlling the hardening ratio of a conductive material allowed to be at the B-stage and still further enhancing the conduction reliability of the resulting connected structure, it is preferred that the above-mentioned hardenable compound having a (meth)acryloyl group have one or two (meth)acryloyl groups.

As the above-mentioned hardenable compound having a (meth)acryloyl group, an ester compound obtained by allowing (meth)acrylic acid and a compound having a hydroxyl group to react with each other, an epoxy (meth)acrylate obtained by allowing (meth)acrylic acid and an epoxy compound to react with each other, a urethane (meth) acrylate obtained by allowing an isocyanate to react with a (meth)acrylic acid derivative having a hydroxyl group, or the like is suitably used. The above-mentioned "a (meth) acryloyl group" refers to an acryloyl group and a methacryloyl group. The above-mentioned "(meth)acrylic" refers to acrylic and methacrylic. The above-mentioned "a (meth) acrylate" refers to an acrylate and a methacrylate.

The above-mentioned ester compound obtained by allowing (meth)acrylic acid and a compound having a hydroxyl group to react with each other is not particularly limited. As the ester compound, any one of a monofunctional ester compound, a bifunctional ester compound and a tri- or more functional ester compound is usable.

Moreover, the above-mentioned hardenable compound having an unsaturated double bond may be a crosslinkable compound and may be a noncrosslinkable compound.

Specific examples of the above-mentioned crosslinkable compound include 1,4-butanediol di(meth)acrylate, 1,6-hexanediol di(meth)acrylate, 1,9-nonanediol di(meth)acrylate, (poly)ethylene glycol di(meth)acrylate, (poly)propylene glycol di(meth)acrylate, neopentyl glycol di(meth) acrylate, pentaerythritol di(meth)acrylate, glycerin methacrylate-acrylate, pentaerythritol tri(meth)acrylate, trimethylol propane trimethacrylate, allyl (meth)acrylate, vinyl (meth)acrylate, divinylbenzene, polyester (meth)acrylate, urethane (meth)acrylate, and the like.

Specific examples of the above-mentioned noncrosslinkable compound include ethyl (meth)acrylate, n-propyl (meth)acrylate, isopropyl (meth)acrylate, n-butyl (meth) acrylate, isobutyl (meth)acrylate, t-butyl (meth)acrylate, pentyl (meth)acrylate, hexyl (meth)acrylate, heptyl (meth) acrylate, 2-ethylhexyl (meth)acrylate, n-octyl (meth)acrylate, isooctyl (meth)acrylate, nonyl (meth)acrylate, decyl (meth)acrylate, undecyl (meth)acrylate, dodecyl (meth) acrylate, tridecyl (meth)acrylate, tetradecyl (meth)acrylate, and the like.

It is preferred that the above-mentioned hardenable compound having an epoxy group have an aromatic ring. Examples of the above-mentioned aromatic ring include a benzene ring, a naphthalene ring, an anthracene ring, a phenanthrene ring, a tetracene ring, a chrysene ring, a triphenylene ring, a tetraphene ring, a pyrene ring, a pentacene ring, a picene ring, a perylene ring, and the like. Of these, it is preferred that the above-mentioned aromatic ring be a benzene ring, a naphthalene ring or an anthracene ring, and it is more preferred that the aromatic ring be a benzene ring or a naphthalene ring. Moreover, a naphthalene ring is preferred because the naphthalene ring has a planar structure and this allows the hardenable compound to be more quickly hardened.

Examples of the above-mentioned hardenable compound having an epoxy group include a resorcinol type epoxy compound, a naphthalene type epoxy compound, an anthracene type epoxy compound, a bisphenol A type epoxy compound, a bisphenol F type epoxy compound, a cresol novolak type epoxy compound, a phenol novolak type epoxy compound, a glycidyl ester type epoxy compound obtained by allowing a polybasic acid compound having an aromatic skeleton and epichlorohydrin to react with each other, a glycidyl ether type epoxy compound having an aromatic skeleton, 2-(3,4-epoxy)cyclohexyl-5,5-spiro-(3,4-epoxy)cyclohexane-m-dioxane, 3,4-epoxy cyclohexenyl methyl-3',4'-epoxy cyclohexene carboxylate, dicyclopentadiene dioxide, vinylcyclohexene monoxide, 1,2-epoxy-4-vinylcyclohexane, 1,2:8,9-diepoxylimonene, ε-caprolactone-modified tetra(3,4-epoxycyclohexylmethyl) butane tetracarboxylate, a 1,2-epoxy-4-(2-oxiranyl)cyclohexane adduct of 2,2-bis(hydroxymethyl)-1-butanol, and the like.

Relative to 100% by weight of the above-mentioned conductive material, the content of the above-mentioned anionically hardenable compound is preferably greater than or equal to 5% by weight, more preferably greater than or equal to 7% by weight, preferably less than or equal to 90% by weight, and more preferably less than or equal to 80% by weight.

(Anionic Hardener)

The above-mentioned conductive material includes a hardener. The above-mentioned conductive material includes an anionic hardener as the hardener. One kind of the above-mentioned anionic hardener may be used alone, and two or more kinds thereof may be combinedly used.

Examples of the above-mentioned anionic hardener include an imidazole hardener, a polythiol hardener, an amine hardener, and the like. Of these, an imidazole hardener or an amine hardener is preferred because the hardener allows the conductive material to be more quickly hardened at a low temperature. Moreover, a latent hardener is preferred because the storage stability is enhanced when a hardenable compound hardenable by heating and the above-mentioned thermal hardener are mixed. It is preferred that the latent hardener be a latent imidazole hardener, a latent polythiol hardener or a latent amine hardener.

The above-mentioned imidazole hardener is not particularly limited, and examples thereof include 2-methyl imidazole, 2-ethyl-4-methyl imidazole, 1-cyanoethyl-2-phenyl imidazole, 1-cyanoethyl-2-phenyl imidazolium trimellitate, 2,4-diamino-6-[2'-methylimidazolyl-(1')]-ethyl-s-triazine, 2,4-diamino-6-[2'-methylimidazolyl-(1')]-ethyl-s-triazine isocyanuric acid adduct, and the like.

The above-mentioned polythiol hardener is not particularly limited, and examples thereof include trimethylolpropane tris-3-mercaptopropionate, pentaerythritol tetrakis-3-mercaptopropionate, dipentaerythritol hexa-3-mercaptopropionate, and the like.

The above-mentioned amine hardener is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, methaphenylenediamine, diaminodiphenyl sulfone, and the like.

The content of the above-mentioned anionic hardener is not particularly limited. Relative to 100 parts by weight of the above-mentioned anionically hardenable compound, the content of the above-mentioned anionic hardener is preferably greater than or equal to 1 part by weight, more preferably greater than or equal to 5 parts by weight, further preferably greater than or equal to 7 parts by weight, preferably less than or equal to 30 parts by weight, more preferably less than or equal to 15 parts by weight, further preferably less than or equal to 10 parts by weight, and especially preferably less than or equal to 8 parts by weight. When the content of the above-mentioned anionic hardener is greater than or equal to the above lower limit, it is easy to allow the conductive material to be sufficiently hardened. When the content of the above-mentioned anionic hardener is less than or equal to the above upper limit, the excessive anionic hardener, which has not taken part in the hardening, hardly remains after the hardening, and the heat resistance of the hardened product is more enhanced.

(Organic Acid a and Compound Similar to the Organic Acid A)

The above-mentioned organic acid A is an organic acid having a carboxyl group and having a functional group formed by esterifying a carboxyl group. The above-mentioned organic acid A has at least one carboxyl group. The above-mentioned organic acid A has at least one functional group that is an esterified carboxyl group. One kind of the above-mentioned organic acid A may be used alone, and two or more kinds thereof may be combinedly used.

It is preferred that the above-mentioned organic acid A be an organic acid obtained by esterifying a part of carboxyl groups in an organic acid having a plurality of carboxyl groups.

From the viewpoint of achieving both excellent reaction rate and excellent fluxing effect at a higher level, it is preferred that the above-mentioned organic acid A be obtained by allowing an organic acid having a plurality of carboxyl groups and an alcohol to react with each other so that a part of carboxyl groups is esterified.

The above-mentioned organic acid having a plurality of carboxyl groups has two or more carboxyl groups and may have three or more carboxyl groups. It is preferred that the above-mentioned organic acid having a plurality of carboxyl groups have two to four carboxyl groups, it is more preferred that the above-mentioned organic acid having a plurality of carboxyl groups have two or three carboxyl groups, and it is further preferred that the above-mentioned organic acid having a plurality of carboxyl groups have two carboxyl groups.

Since the esterification is easily performed, it is preferred that the above-mentioned alcohol be an alcohol with 1 to 4 carbon atoms. Since the esterification is easily performed, it is more preferred that the above-mentioned alcohol be methanol or ethanol, and it is further preferred that the above-mentioned alcohol be methanol.

In the reaction between the above-mentioned organic acid having a plurality of carboxyl groups and the above-mentioned alcohol, it is preferred that a catalyst be used, and it is more preferred that a tin catalyst be used.

Examples of the above-mentioned organic acid having a plurality of carboxyl groups include a compound having a carboxyl group bonded to an alkyl chain, a compound having a carboxyl group bonded to an aromatic ring, and the like. These compounds having a carboxyl group may be prepared by further allowing a hydroxyl group to be bonded to the alkyl chain or the aromatic ring. It is preferred that the number of carboxyl groups bonded to the alkyl chain or the aromatic ring be 2 or 3, and it is more preferred that the number be 2. The number of carbon atoms of an alkyl chain in a compound having a carboxyl group bonded to an alkyl chain is preferably greater than or equal to 3, preferably less than or equal to 8, and more preferably less than or equal to 6. Specific examples of a compound having a carboxyl group bonded to an alkyl chain include glutaric acid (number of carbon atoms of 4, two carboxyl groups), adipic acid, and the like. Specific examples of a compound having a carboxyl group bonded to an aromatic ring include phthalic acid, and the like.

The above-mentioned conductive material may include an esterified substance (hereinafter, sometimes referred to as an esterified substance B) obtained by esterifying all of carboxyl groups in an organic acid having a plurality of carboxyl groups.

The above-mentioned conductive material may further include an organic acid (hereinafter, sometimes referred to as an organic acid C) having a plurality of carboxyl groups but having no functional group that is an esterified carboxyl group.

The above-mentioned conductive material may include the above-mentioned organic acid A, the above-mentioned esterified substance B and the above-mentioned organic acid C.

In the case where the above-mentioned organic acid A is obtained by esterifying a part of carboxyl groups in an organic acid having a plurality of carboxyl groups, the above-mentioned organic acid A is frequently obtained together with the above-mentioned esterified substance B and the above-mentioned organic acid C. As compared with a conductive material including only the above-mentioned organic acid A, a conductive material including the above-mentioned organic acid A and one of the above-mentioned esterified substance B and the above-mentioned organic acid C is easily obtained, and a conductive material including the above-mentioned organic acid A, the above-mentioned esterified substance B and the above-mentioned organic acid C is more easily obtained without undergoing a separating step.

Relative to 100% by weight of the above-mentioned conductive material, the content of the above-mentioned organic acid A is preferably greater than or equal to 0.1% by weight, more preferably greater than or equal to 0.5% by weight, preferably less than or equal to 5% by weight, and more preferably less than or equal to 3% by weight.

Relative to 100% by weight of the above-mentioned conductive material, the total content of the above-mentioned organic acid A, the above-mentioned esterified substance B and the above-mentioned organic acid C (the total content of the organic acid A and the organic acid C in the case where the above-mentioned esterified substance B is not included, the total content of the organic acid A and the esterified substance B in the case where the above-mentioned organic acid C is not included) is preferably greater than or equal to 0.2% by weight, more preferably greater than or equal to 0.8% by weight, preferably less than or equal to 5.5% by weight, and more preferably less than or equal to 3.5% by weight.

In the total of an organic acid A, an esterified substance B and an organic acid C, relative to 100% of the whole number of carboxyl groups and functional groups that are esterified carboxyl groups, the proportion of the functional group that is an esterified carboxyl group (hereinafter, sometimes referred to as the esterification rate) is preferably greater than or equal to 10%, more preferably greater than or equal to 20%, further preferably greater than or equal to 30%, preferably less than or equal to 80%, more preferably less than or equal to 70%, and further preferably less than or equal to 60%.

(Conductive Particles)

The above-mentioned conductive particle is not particularly limited as long as at least the external surface is made of solder. It is preferred that the above-mentioned conductive particle have a base material particle and a conductive layer arranged on the surface of the base material particle, and the above-mentioned conductive particle be a conductive particle having a solder layer at at least the external surface of the conductive layer. Examples of the above-mentioned base material particle include a resin particle, an inorganic particle excluding the metal particle, an organic-inorganic hybrid particle, a metal particle, and the like. The above-mentioned base material particle may be a core-shell particle. It is preferred that the above-mentioned base material particle be a base material particle which is not a metal particle, and it is more preferred that the above-mentioned base material particle be a resin particle, an inorganic particle excluding the metal particle, or an organic-inorganic hybrid particle. It is preferred that the above-mentioned base material particle be a resin particle formed of a resin. At the time of connecting electrodes, conductive particles are arranged between the electrodes, after which the conductive particles are generally compressed. When the base material particle is a resin particle, the conductive particle is easily deformed by compression, and the contact area between the conductive particle and the electrode is increased. As such, it is possible to enhance the conduction reliability between electrodes. From the viewpoint of further enhancing the thermal shock resistance characteristics in a connected structure, it is preferred that the above-mentioned conductive particle have a resin particle and a conductive layer arranged on the surface of the resin particle, and the above-mentioned conductive particle be a conductive particle having a solder layer at at least the external surface of the conductive layer.

In FIG. 1, a conductive particle contained in the conductive material in accordance with one embodiment of the present invention is shown by a cross-sectional view.

The conductive particle 1 shown in FIG. 1 has a resin particle 2 and a conductive layer 3 arranged on the surface 2a of the resin particle 2. The conductive layer 3 covers the surface 2a of the resin particle 2. The conductive particle 1 is a covered particle in which the surface 2a of the resin particle 2 is covered with the conductive layer 3. Accordingly, the conductive particle 1 has a conductive layer 3 on the surface 1a.

The conductive layer 3 has a first conductive layer 4 arranged on the surface 2a of the resin particle 2 and a solder layer 5 (a second conductive layer) arranged on the surface 4a of the first conductive layer 4. The outer surface layer of the conductive layer 3 is the solder layer 5. Accordingly, the conductive particle 1 has a solder layer 5 as a part of the conductive layer 3 (conductive part), and furthermore, between the resin particle 2 and the solder layer 5, has a first conductive layer 4 as a part of the conductive layer 3 (conductive part) apart from the solder layer 5. On this account, the conductive layer 3 may have a multilayer structure, and may have a layered structure composed of two or more layers.

Figure 2:
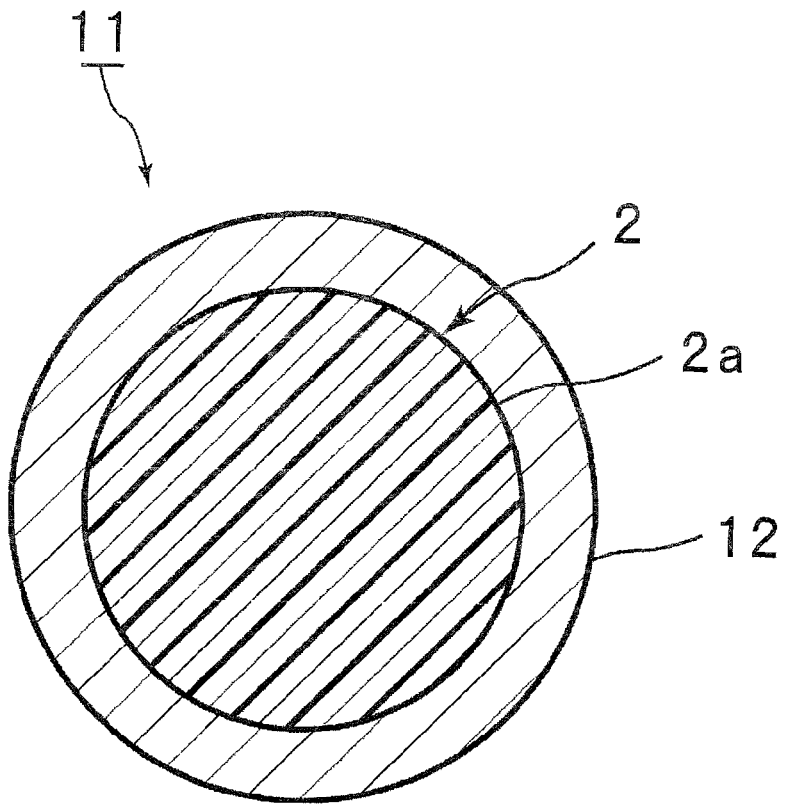
FIG. 2 is a cross-sectional view showing a variation of the conductive particle.
Figure 3:
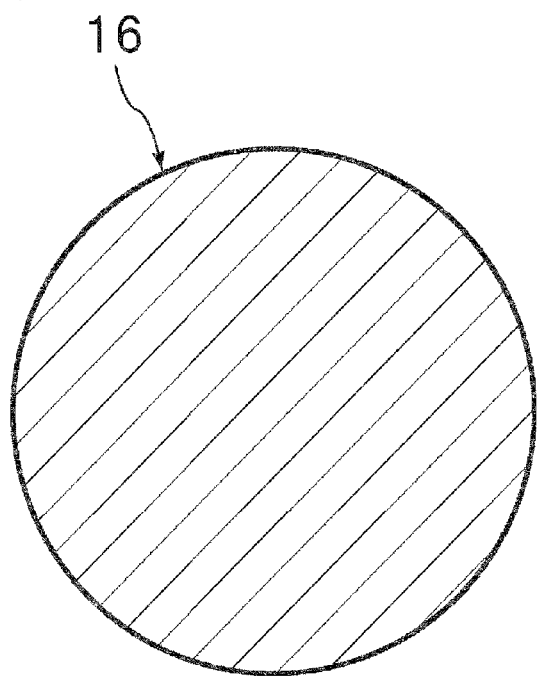
FIG. 3 is a cross-sectional view showing another variation of the conductive particle.

As mentioned above, the conductive layer 3 has a bilayer structure. Like the variation shown in FIG. 2, a conductive particle 11 may have a solder layer 12 as a conductive layer of a single layer. At least the outer surface of the conductive part of the conductive particle should be made of solder, and for example, it is preferred that at least the outer surface layer of the conductive layer in a conductive particle be constituted of a solder layer. However, since the preparation of conductive particles is easy, among the conductive particle 1 and the conductive particle 11, the conductive particle 1 is preferred. Moreover, like the variation shown in FIG. 3, a solder particle 16 which does not have a base material particle as a core and is not a core-shell particle may be used. The solder particle 16 allows both of the central portion and the external surface to be formed of solder. In this context, among the conductive particle 1, the conductive particle 11 and the solder particle 16, the conductive particle 1 and the conductive particle 11 are preferred.

As a resin for forming the above-mentioned resin particle, various organic substances are suitably used. Examples of the resin for forming the above-mentioned resin particle include a polyolefin resin such as polyethylene, polypropylene, polystyrene, polyvinyl chloride, polyvinylidene chloride, polyisobutylene and polybutadiene; an acrylic resin such as polymethyl methacrylate and polymethyl acrylate; a polyalkylene terephthalate, a polycarbonate, a polyamide, a phenol formaldehyde resin, a melamine formaldehyde resin, a benzoguanamine formaldehyde resin, a urea formaldehyde resin, a phenol resin, a melamine resin, a benzoguanamine resin, a urea resin, an epoxy resin, an unsaturated polyester resin, a saturated polyester resin, a polysulfone, a polyphenylene oxide, a polyacetal, a polyimide, a polyamideimide, a polyether ether ketone, a polyether sulfone, a polymer obtained by allowing a variety of one kind or two or more kinds of polymerizable monomers having an ethylenically unsaturated group to undergo a polymerization, and the like. Since a resin particle having physical properties at the time of optional compression suitable for the conductive material can be designed and synthesized and the hardness of a base material particle can be easily controlled within a suitable range, it is preferred that the resin for forming the above-mentioned resin particle be a polymer obtained by allowing one kind or two or more kinds of polymerizable monomers having a plurality of ethylenically unsaturated groups to undergo a polymerization.

In the case of allowing a monomer having an ethylenically unsaturated group to undergo a polymerization to obtain the above-mentioned resin particle, examples of the above-mentioned monomer having an ethylenically unsaturated group include a noncrosslinkable monomer and a crosslinkable monomer.

Examples of the above-mentioned noncrosslinkable monomer include a styrene-based monomer such as styrene and α-methylstyrene; a carboxyl group-containing monomer such as (meth)acrylic acid, maleic acid and maleic anhydride; a kind of alkyl (meth)acrylate such as methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate and isobornyl (meth)acrylate; a kind of oxygen atom-containing (meth)acrylate such as 2-hydroxyethyl (meth)acrylate, glycerol (meth)acrylate, polyoxyethylene (meth)acrylate and glycidyl (meth)acrylate; a nitrile-containing monomer such as (meth)acrylonitrile; a kind of vinyl ether such as methyl vinyl ether, ethyl vinyl ether and propyl vinyl ether; a kind of vinyl ester of an acid such as vinyl acetate, vinyl butylate, vinyl laurate and vinyl stearate; an unsaturated hydrocarbon such as ethylene, propylene, isoprene and butadiene; a halogen-containing monomer such as trifluoromethyl (meth)acrylate, pentafluoroethyl (meth)acrylate, vinyl chloride, vinyl fluoride and chlorostyrene, and the like.

Examples of the above-mentioned crosslinkable monomer include a kind of multifunctional (meth)acrylate such as tetramethylolmethane tetra(meth)acrylate, tetramethylolmethane tri(meth)acrylate, tetramethylolmethane di(meth)acrylate, trimethylolpropane tri(meth)acrylate, dipentaerythritol hexa(meth)acrylate, dipentaerythritol penta(meth)acrylate, glycerol tri(meth)acrylate, glycerol di(meth)acrylate, (poly)ethylene glycol di(meth)acrylate, (poly)propylene glycol di(meth)acrylate, (poly)tetramethylene glycol di(meth)acrylate and 1,4-butanediol di(meth)acrylate; a silane-containing monomer such as triallyl (iso)cyanurate, triallyl trimellitate, divinylbenzene, diallyl phthalate, diallyl acrylamide, diallyl ether, γ-(meth)acryloxypropyltrimethoxysilane, trimethoxysilyl styrene and vinyltrimethoxysilane, and the like.

By allowing the above-mentioned polymerizable monomer having an ethylenically unsaturated group to undergo a polymerization by a known method, the above-mentioned resin particle can be obtained. Examples of this method include a method of performing a suspension polymerization in the presence of a radical polymerization initiator, a method of using a noncrosslinkable seed particle and allowing a monomer to be swollen and to undergo a polymerization together with a radical polymerization initiator, and the like.

In the case where the above-mentioned base material particle is an inorganic particle excluding the metal particle or an organic-inorganic hybrid particle, examples of an inorganic substance for forming the above-mentioned base material particle include silica, carbon black, and the like. Although a particle formed of the above-mentioned silica is not particularly limited, examples thereof include a particle obtained by hydrolyzing a silicon compound having two or more hydrolyzable alkoxysilyl groups to form a crosslinked polymer particle and then performing firing as necessary. Examples of the above-mentioned organic-inorganic hybrid particle include an organic-inorganic hybrid particle formed of an alkoxysilyl polymer and an acrylic resin which are crosslinked to each other, and the like.

In the case where the above-mentioned base material particle is a metal particle, examples of a metal for forming the metal particle include silver, copper, nickel, silicon, gold, titanium and the like. In this context, it is preferred that the above-mentioned base material particle not be a metal particle.

The average particle diameter of the above-mentioned base material particles is preferably greater than or equal to 1 μm, more preferably greater than or equal to 2 μm, preferably less than or equal to 100 μm, more preferably less than or equal to 50 μm, further preferably less than or equal to 30 μm, and especially preferably less than or equal to 5 μm. When the average particle diameter of the base material particles is greater than or equal to the above lower limit, the conduction reliability between electrodes is more enhanced. When the average particle diameter of the base material particles is less than or equal to the above upper limit, it is possible to make the interval between electrodes become narrow.

The method for forming a conductive layer on the surface of the above-mentioned base material particle and the method for forming a solder layer on the surface of the above-mentioned base material particle or on the surface of the first conductive layer are not particularly limited. Examples of the method for forming the above-mentioned conductive layer or the above-mentioned solder layer include a method by electroless plating, a method by electroplating, a method by physical collision, a method by a mechanochemical reaction, a method by physical vapor deposition or physical adsorption, and a method of coating a paste containing metal powder or metal powder and a binder on the surface of base material particles, and the like. Of these, a method by electroless plating, electroplating or physical collision is preferred. Examples of the above-mentioned method by physical vapor deposition include methods such as vacuum vapor deposition, ion plating and ion sputtering. Moreover, in the above-mentioned method by physical collision, for example, Theta Composer (available from TOKUJU CORPORATION) or the like is used.

It is preferred that the method for forming the above-mentioned solder layer on the surface of the above-mentioned first conductive layer be a method by physical collision. It is preferred that the above-mentioned solder layer be arranged on the surface of the above-mentioned first conductive layer by utilizing physical impact.

It is preferred that the material constituting the above-mentioned solder (solder layer) be a filler metal with a liquidus line lying within the range of 450° C. or lower on the basis of JIS Z3001: Welding and allied processes-Vocabulary. Examples of the composition of the above-mentioned solder include a metal composition containing zinc, gold, lead, copper, tin, bismuth, indium, and the like. Of these, tin-indium based one (the eutectic temperature of 117° C.) which has a low melting point and is free from lead, or tin-bismuth based one (the eutectic temperature of 139° C.) is preferred. That is, it is preferred that the above-mentioned solder be free from lead, and it is preferred that the above-mentioned solder be solder containing tin and indium or solder containing tin and bismuth.

The melting point of the above-mentioned solder (solder layer) is preferably higher than or equal to 80° C., more preferably higher than or equal to 100° C., preferably lower than or equal to 200° C., more preferably lower than or equal to 160° C., further preferably lower than or equal to 150° C., and still further preferably lower than or equal to 140° C. It is more preferred that the melting point of the above-mentioned solder (solder layer) be higher than or equal to 100° C. and lower than or equal to 140° C.

In order to further heighten the joining strength between the above-mentioned solder (solder layer) and the electrode, the above-mentioned solder may contain a metal such as nickel, copper, antimony, aluminum, zinc, iron, gold, titanium, phosphorus, germanium, tellurium, cobalt, bismuth, manganese, chromium, molybdenum and palladium. From the viewpoint of still further heightening the joining strength between the solder and the electrode, it is preferred that the above-mentioned solder contain nickel, copper, antimony, aluminum or zinc. From the viewpoint of further heightening the joining strength between the solder and the electrode, the content of these metals for heightening the joining strength is preferably greater than or equal to 0.0001% by weight and preferably less than or equal to 1% by weight relative to 100% by weight of the above-mentioned solder (solder layer).

It is preferred that the above-mentioned conductive particle have a base material particle and a conductive layer arranged on the surface of the base material particle, the outer surface of the conductive layer be constituted of a solder layer, and the above-mentioned conductive particle have a first conductive layer, apart from the above-mentioned solder layer, between the above-mentioned base material particle and the above-mentioned solder layer. In this case, the above-mentioned solder layer is a part of the whole conductive layer mentioned above, and the above-mentioned first conductive layer is a part of the whole conductive layer mentioned above.

It is preferred that the above-mentioned first conductive layer, which the conductive particle has apart from the above-mentioned solder layer, contain a metal. The metal constituting the first conductive layer is not particularly limited. Examples of the metal include gold, silver, copper, platinum, palladium, zinc, lead, aluminum, cobalt, indium, nickel, chromium, titanium, antimony, bismuth, germanium, cadmium, and an alloy thereof, and the like. Moreover, as the above-mentioned metal, a tin-doped indium oxide (ITO) may be used. One kind of the above-mentioned metal may be used alone, and two or more kinds thereof may be combinedly used.

It is preferred that the above-mentioned first conductive layer be a nickel layer, a palladium layer, a copper layer or a gold layer, it is more preferred that the above-mentioned first conductive layer be a nickel layer or a gold layer, and it is further preferred that the above-mentioned first conductive layer be a copper layer. It is preferred that the conductive particle have a nickel layer, a palladium layer, a copper layer or a gold layer, it is more preferred that the conductive particle have a nickel layer or a gold layer, and it is further preferred that the conductive particle have a copper layer. By using conductive particles having these preferred conductive layers for the connection between electrodes, the connection resistance between electrodes is more decreased. Moreover, on the surface of these preferred conductive layers, a solder layer can be more easily formed. In this connection, the above-mentioned first conductive layer may be a solder layer. The conductive particle may have a plurality of layers of solder layers.

The particle diameter of a conductive particle having a solder layer as the outer surface layer of a conductive layer has hitherto been several hundreds of μm or so. This is because the solder layer has failed to be uniformly formed even at the time of attempting to obtain a conductive particle which has a particle diameter of several tens of μm and allows the surface layer to be constituted of a solder layer. In contrast, in the case of optimizing the dispersion conditions at the time of electroless plating to form a solder layer, even in the case of obtaining a conductive particle having a particle diameter of several tens of μm, especially a conductive particle having a particle diameter greater than or equal to 0.1 μm and less than or equal to 50 μm, a solder layer can be uniformly formed on the surface of the first conductive layer. Moreover, by using Theta Composer, even in the case of obtaining a conductive particle having a particle diameter less than or equal to 50 μm, a solder layer can be uniformly formed on the surface of the first conductive layer.

The content of tin is preferably less than 90% by weight, more preferably less than or equal to 85% by weight, relative to 100% by weight of the above-mentioned solder and the above-mentioned solder layer. Moreover, the content of tin relative to 100% by weight of the solder and the solder layer is appropriately determined in view of the melting points of the solder and the solder layer, and the like. The content of tin relative to 100% by weight of the solder and the solder layer is preferably greater than or equal to 5% by weight, more preferably greater than or equal to 10% by weight, and further preferably greater than or equal to 20% by weight.

Each of the thicknesses of the above-mentioned first conductive layer and the above-mentioned solder layer is preferably greater than or equal to 10 nm, more preferably greater than or equal to 50 nm, further preferably greater than or equal to 100 nm, preferably less than or equal to 2000 nm, and more preferably less than or equal to 1000 nm. When each of the thicknesses of the first conductive layer and the solder layer is greater than or equal to the above lower limit, the conductivity is sufficiently enhanced. When each of the thicknesses of the first conductive layer and the solder layer is less than or equal to the above upper limit, the difference in coefficient of thermal expansion between the base material particle, and the first conductive layer and the solder layer becomes small, and the exfoliation in the first conductive layer and the solder layer hardly occurs.

The above-mentioned first conductive layer may have a layered structure composed of two or more layers. In the case where the above-mentioned first conductive layer has a layered structure composed of two or more layers, the thickness of the outermost layer in the first conductive layer is preferably greater than or equal to 5 nm, more preferably greater than or equal to 10 nm, further preferably greater than or equal to 25 nm, especially preferably greater than or equal to 50 nm, preferably less than or equal to 1000 nm, and more preferably less than or equal to 500 nm. When the thickness of the outermost layer in the first conductive layer is greater than or equal to the above lower limit, the conductivity is sufficiently enhanced. When the thickness of the outermost layer in the first conductive layer is less than or equal to the above upper limit, the difference in coefficient of thermal expansion between the base material particle and the outermost layer in the first conductive layer becomes small, and the exfoliation of the outermost layer in the first conductive layer hardly occurs.

The average particle diameter of the above-mentioned conductive particles is preferably greater than or equal to 0.1 μm, more preferably greater than or equal to 1 μm, preferably less than or equal to 100 μm, more preferably less than or equal to 80 μm, further preferably less than or equal to 50 μm, and especially preferably less than or equal to 40 μm. When the average particle diameter of the conductive particle is greater than or equal to the above lower limit and less than or equal to the above upper limit, the contact area between the conductive particle and the electrode is sufficiently increased, and aggregated conductive particles are hardly formed at the time of forming a conductive layer. Moreover, the particle diameter is suitable for the size of a conductive particle in the conductive material, the interval between electrodes connected to each other through the conductive particle does not become too large, and a conductive layer hardly peels off from the surface of a base material particle.

The above-mentioned resin particles can be properly used depending on the electrode size or the land diameter of a substrate for mounting.

From the viewpoints of more surely connecting the upper and lower electrodes and further suppressing a short circuit between electrodes adjacent to each other in the lateral direction, the ratio (C/A) of the average particle diameter C of the conductive particles to the average particle diameter A of the resin particles is greater than 1.0 and preferably less than or equal to 3.0. Moreover, in the case where the above-mentioned first conductive layer is disposed between the above-mentioned resin particle and the above-mentioned solder layer, the ratio (B/A) of the average particle diameter B of diameters of the conductive particle portion excluding the solder layer to the average particle diameter A of the resin particles is greater than 1.0 and preferably less than or equal to 2.0. Furthermore, in the case where the above-mentioned first conductive layer is disposed between the above-mentioned resin particle and the above-mentioned solder layer, the ratio (C/B) of the average particle diameter C of the conductive particles including the solder layer to the average particle diameter B of diameters of the conductive particle portion excluding the solder layer is greater than 1.0 and preferably less than or equal to 2.0. When the above-mentioned ratio (B/A) lies within the above-mentioned range or the above-mentioned ratio (C/B) lies within the above-mentioned range, it is possible to more surely connect the upper and lower electrodes and to further suppress a short circuit between electrodes adjacent to each other in the lateral direction.

Conductive Material for Use in FOB and FOF:

The conductive material according to the present invention is suitably used for the connection of a flexible printed circuit board and a glass epoxy board (FOB (Film on Board)) or the connection of a flexible printed circuit board and a flexible printed circuit board (FOF (Film on Film)).

For the use in FOB and FOF, the L & S indicating the dimension of a part with the electrode (line) and a part without the electrode (space) is generally 100 to 500 µm. It is preferred that the average particle diameter of resin particles used for the use in FOB and FOB be 10 to 100 µm. When the average particle diameter of the resin particles is greater than or equal to 10 µm, the thickness of a conductive material and a connection part arranged between electrodes is sufficiently thickened, and the adhesive force is more heightened. When the average particle diameter of the resin particles is less than or equal to 100 µm, a short circuit between electrodes adjacent to each other more hardly occurs.

Conductive Material for Use in Flip Chip:

The conductive material according to the present invention is suitably used for the use in flip chip.

For the use in flip chip, the land diameter is generally 15 to 80 µm. It is preferred that the average particle diameter of resin particles used for the use in flip chip be 1 to 15 µm. When the average particle diameter of the resin particles is greater than or equal to 1 µm, the thickness of a solder layer arranged on the surface of the resin particle can be sufficiently thickened, and the electrodes can be more surely electrically connected. When the average particle diameter of the resin particles is less than or equal to 15 µm, a short circuit between electrodes adjacent to each other more hardly Occurs.

Conductive Material for COF:

The conductive material according to the present invention is suitably used for the connection of a semiconductor chip and a flexible printed circuit board (COF (Chip on Film)).

For the use in COF, the L & S indicating the dimension of a part with the electrode (line) and a part without the electrode (space) is generally 10 to 50 µm. It is preferred that the average particle diameter of resin particles used for the use in COF be 1 to 10 µm. When the average particle diameter of the resin particles is greater than or equal to 1 µm, the thickness of a solder layer arranged on the surface of the resin particle can be sufficiently thickened, and the electrodes can be more surely electrically connected. When the average particle diameter of the resin particles is less than or equal to 10 µm, a short circuit between electrodes adjacent to each other more hardly occurs.

The "average particle diameter" of the above-mentioned base material particles (the above-mentioned resin particles or the like) or the above-mentioned conductive particles refers to the number average particle diameter. The average particle diameter of the above-mentioned base material particles (the above-mentioned resin particles or the like) or the above-mentioned conductive particles is determined by observing 50 optional conductive particles with an electron microscope or an optical microscope and calculating a mean value.

Relative to 100% by weight of the above-mentioned conductive material, the content of the above-mentioned conductive particles is greater than or equal to 3% by weight and less than or equal to 40% by weight. Since the content of the above-mentioned conductive particles is greater than or equal to 3% by weight and less than or equal to 40% by weight, at the time of attaining the anisotropic conductive connection, it is possible to achieve both conduction properties and insulation properties. Relative to 100% by weight of the above-mentioned conductive material, the content of the above-mentioned conductive particles is preferably greater than or equal to 5% by weight, more preferably greater than or equal to 10% by weight, further preferably greater than or equal to 15% by weight, preferably less than or equal to 35% by weight, and more preferably less than or equal to 30% by weight. When the content of the above-mentioned conductive particles relative to 100% by weight of the above-mentioned conductive material is greater than or equal to the above lower limit and less than or equal to the above upper limit, the conductive particles can be easily arranged between upper and lower electrodes which are to be connected. Furthermore, electrodes adjacent to each other, which are not to be connected, are hardly electrically connected to each other through a plurality of conductive particles. That is, a short circuit between adjacent electrodes can be more prevented.

(Other Ingredients)

It is preferred that the above-mentioned conductive material contain a filler. By using the filler, the coefficient of linear thermal expansion of a hardened product of the conductive material can be suppressed. Specific examples of the above-mentioned filler include silica, aluminum nitride, alumina, glass, boron nitride, silicon nitride, silicone, carbon, graphite, graphene, talc, and the like. One kind of the filler may be used alone, and two or more kinds thereof may be combinedly used. When a filler high in thermal conductivity is used, the main hardening time is shortened.

The above-mentioned conductive material may contain a solvent. By using the solvent, the viscosity of the conductive material can be easily adjusted. Examples of the above-mentioned solvent include ethyl acetate, methyl cellosolve, toluene, acetone, methyl ethyl ketone, cyclohexane, n-hexane, tetrahydrofuran, diethyl ether, and the like.

From the viewpoint of further enhancing the connection reliability of a connection object member, it is preferred that the above-mentioned conductive material contain an adhesiveness imparting agent. Examples of the above-mentioned adhesiveness imparting agent include a coupling agent, a flexible material, and the like. One kind of the adhesiveness imparting agent may be used alone, and two or more kinds thereof may be combinedly used.

Relative to 100% by weight of the above-mentioned conductive material, the content of the above-mentioned adhesiveness imparting agent is preferably greater than or equal to 0.1% by weight, more preferably greater than or equal to 1% by weight, preferably less than or equal to 10% by weight, and more preferably less than or equal to 5% by weight. When the content of the above-mentioned adhesiveness imparting agent is greater than or equal to the above lower limit and less than or equal to the above upper limit, the connection reliability of a connection object member is more enhanced.

(Details and Uses of Conductive Material)

The conductive material according to the present invention is a pasty or film-shaped conductive material, and it is preferred that the conductive material be a pasty conductive material. The pasty conductive material is a conductive paste. The film-shaped conductive material is a conductive film. In the case where the conductive material is a conductive film, a film free from conductive particles may be layered on the conductive film containing conductive particles. It is preferred that the conductive material according to the present invention be an anisotropic conductive material. It is preferred that the conductive material according to the present invention be used for the connection between electrodes, it is preferred that the conductive material be a circuit connection material, and it is further preferred that the conductive material be a circuit connection material used for the electrical connection between electrodes.

It is preferred that the conductive material according to the present invention be a conductive paste, and be a conductive paste which is in a pasty state and is applied on a connection object member.

The viscosity of the above-mentioned conductive paste at 25° C. is preferably greater than or equal to 3 Pa·s, more preferably greater than or equal to 5 Pa·s, preferably less than or equal to 500 Pa·s, and more preferably less than or equal to 300 Pa·s. When the above-mentioned viscosity is greater than or equal to the above lower limit, the sedimentation of conductive particles in the conductive paste can be suppressed. When the above-mentioned viscosity is less than or equal to the above upper limit, the dispersibility of conductive particles is more enhanced. When the above-mentioned viscosity of the above-mentioned conductive paste before being applied lies within the above-mentioned range, after the conductive paste is applied on a first connection object member, the flow of the conductive paste before being hardened can be more suppressed, and furthermore, voids are more hardly generated. In this connection, a pasty one refers to a concept that also includes a liquid one.

It is preferred that the conductive material according to the present invention be a conductive material used for connecting connection object members having a copper electrode. In the case where connection object members having a copper electrode are connected by means of a conductive material, there is a problem that migration attributed to the copper electrode in a connected structure easily occurs. In contrast, by using the conductive material according to the present invention, even when connection object members having a copper electrode are connected, migration in a connected structure can be effectively suppressed, and the insulation reliability can be effectively enhanced.

The conductive material according to the present invention can be used for allowing various connection object members to adhere to each other. The above-mentioned conductive material is suitably used for obtaining a connected structure in which first and second connection object members are electrically connected.

The connected structure according to the present invention is provided with a first connection object member having a first electrode on its surface, a second connection object member having a second electrode on its surface, and a connection part connecting the above-mentioned first and second connection object members, the above-mentioned connection part is formed of the conductive material described above, and the above-mentioned first electrode and the above-mentioned second electrode are electrically connected by the above-mentioned conductive particles.

Figure 4:
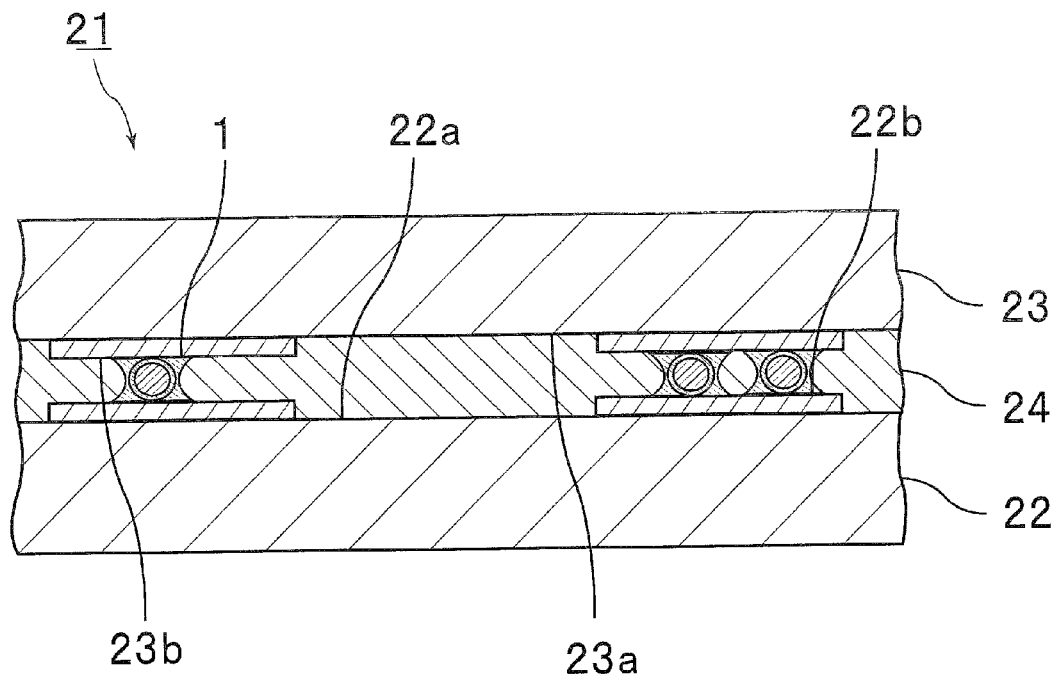
FIG. 4 is a cross-sectional front view schematically showing a connected structure prepared with the conductive material in accordance with one embodiment of the present invention.

In FIG. 4, a connected structure prepared with the conductive material in accordance with one embodiment of the present invention is schematically shown by a cross-sectional front view.

A connected structure 21 shown in FIG. 4 is provided with a first connection object member 22, a second connection object member 23, and a connection part 24 electrically connecting the first and second connection object members 22, 23. The first connection object member 22 and the second connection object member 23 are electronic components. The connection part 24 is formed of a conductive material containing conductive particles 1. In this connection, in FIG. 4, for convenience of illustration, the conductive particles 1 are schematically illustrated.

The first connection object member 22 has a plurality of first electrodes 22b on the surface 22a (upper surface). The second connection object member 23 has a plurality of second electrodes 23b on the surface 23a (lower surface). The first electrode 22b and the second electrode 23b are electrically connected by one or a plurality of conductive particles 1. Accordingly, the first and second connection object members 22, 23 are electrically connected by the conductive particle 1.

The production method of the above-mentioned connected structure is not particularly limited. One example of the production method of the connected structure includes a method of arranging the above-mentioned conductive material between the above-mentioned first connection object member and the above-mentioned second connection object member to obtain a laminate and then heating and pressurizing the laminate, or the like. By heating and pressurizing, the solder layer of the conductive particle 1 is melted and the electrodes are electrically connected by the conductive particle 1. Furthermore, in the case where the binder resin contains a thermally hardenable compound, the binder resin is hardened and the first and second connection object members 22, 23 are connected by the hardened binder resin. The pressure at the time of the above-mentioned pressurizing is $9.8 \times 10^4$ to $4.9 \times 10^6$ Pa or so. The temperature at the time of the above-mentioned heating is 120 to 220° C. or so.

Figure 5:
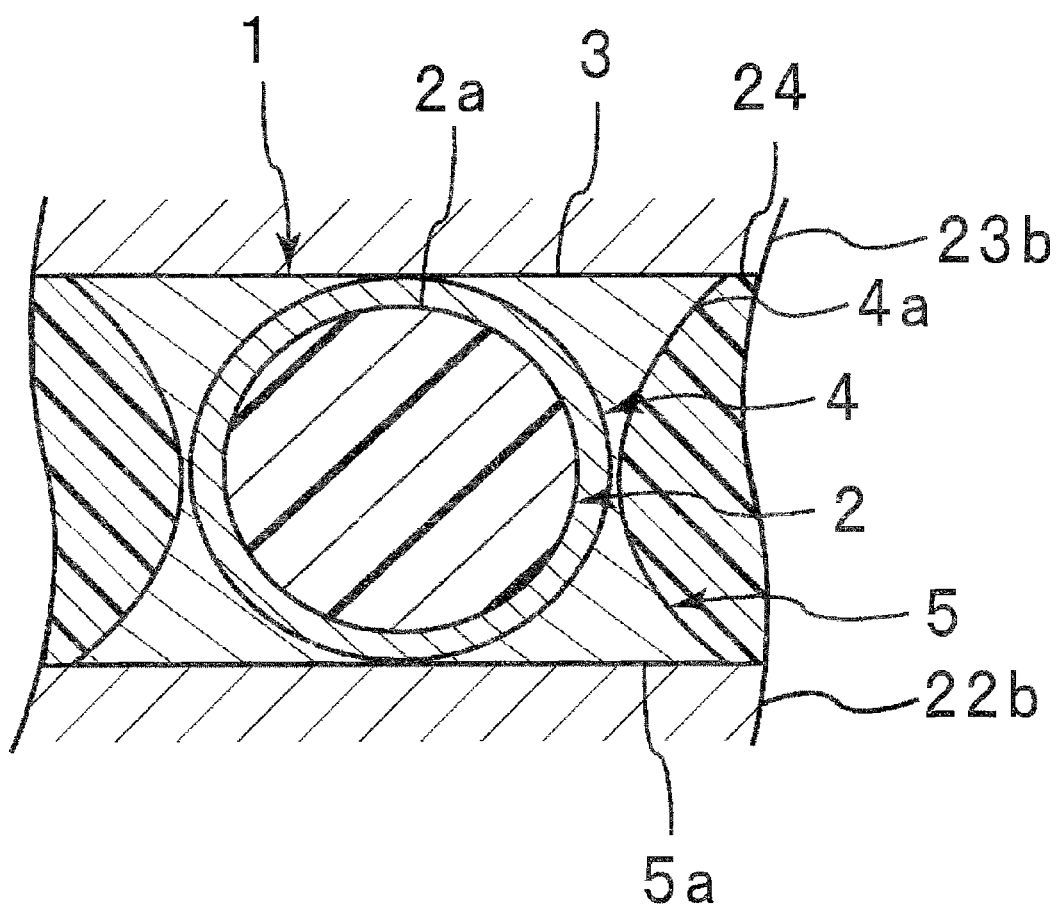
FIG. 5 is a cross-sectional front view schematically showing an enlarged connection portion of the conductive particle and the electrode in the connected structure shown in FIG. 4.

In FIG. 5, an enlarged connection portion of the conductive particle 1 and the first and second electrodes 22b, 23b in the connected structure 21 shown in FIG. 4 is shown by a cross-sectional front view. As shown in FIG. 5, in the connected structure 21, by heating and pressurizing the above-mentioned laminate, a solder layer 5 of the conductive particle 1 is melted and then the melted solder layer portion 5a is sufficiently brought into contact with the first and second electrodes 22b, 23b. That is, by using the conductive particle 1 having the solder layer 5 as the surface layer, as compared with the case of using a conductive particle having a surface layer made of a metal such as nickel, gold or copper as a surface layer of a conductive layer, the contact area between the conductive particle 1 and the electrodes 22b, 23b is increased. As such, the conduction reliability of the connected structure 21 is enhanced. In this connection, by heating, in general, the flux is gradually deactivated.

The above-mentioned first and second connection object members are not particularly limited as long as the connection object members are electronic components. Specifically, examples of the above-mentioned first and second connection object members include an electronic component such as a semiconductor chip, a capacitor and a diode, an electronic component such as a circuit board including a printed circuit board, a flexible printed circuit board, a glass epoxy board and a glass substrate, and the like. It is preferred that the above-mentioned conductive material be a conductive material used for the connection in the electronic component. It is preferred that the conductive material according to the present invention be used for the electrical connection of the electrode in the electronic component.

In the above-mentioned connected structure, with regard to the total contact area of the contact area in the connection portion of the above-mentioned connection part and the above-mentioned first connection object member and the contact area in the connection portion of the above-mentioned connection part and the above-mentioned second connection object member, it is preferred that, in an area greater than or equal to one-fifth of the total contact area, the connection part and the connection object member be connected by a component other than the conductive particles contained in the conductive material. In other words, in the above-mentioned connected structure, with regard to the total contact area of the contact area in the connection portion of the above-mentioned connection part and the above-mentioned first connection object member and the contact area in the connection portion of the above-mentioned connection part and the above-mentioned second connection object member, it is preferred that, in an area less than one-fifth of the total contact area, the connection part and the connection object member be connected by the conductive particles contained in the conductive material. In this case, the thermal shock resistance characteristics of the connected structure are more enhanced.

Examples of the electrode disposed on the above-mentioned connection object member include a metal electrode such as a gold electrode, a nickel electrode, a tin electrode, an aluminum electrode, a copper electrode, a silver electrode, a molybdenum electrode and a tungsten electrode. In the case where the above-mentioned connection object member is a flexible printed circuit board, it is preferred that the above-mentioned electrode be a gold electrode, a nickel electrode, a tin electrode or a copper electrode. In the case where the above-mentioned connection object member is a glass substrate, it is preferred that the above-mentioned electrode be an aluminum electrode, a copper electrode, a molybdenum electrode or a tungsten electrode. In this connection, in the case where the above-mentioned electrode is an aluminum electrode, the electrode may be an electrode formed only of aluminum and may be an electrode having an aluminum layer that is layered on the surface of a metal oxide layer. Examples of the material for the above-mentioned metal oxide layer include an indium oxide doped with a trivalent metal element, a zinc oxide doped with a trivalent metal element, and the like. Examples of the above-mentioned trivalent metal element include Sn, Al, Ga and the like.

It is preferred that at least one of the above-mentioned first electrode and the above-mentioned second electrode be a copper electrode. It is preferred that both of the above-mentioned first electrode and the above-mentioned second electrode be copper electrodes. In this case, a fluxing effect by the conductive material according to the present invention is further attained and the conduction reliability in the connected structure is more enhanced.

Hereinafter, the present invention will be described in detail with reference to examples and comparative examples. The present invention is not limited only to the following examples. In examples and comparative examples, the following materials were used.

(Hardenable Compound)

Thermally hardenable compound A ("EBECRYL 3708" available from DAICEL-ALLNEX LTD.)

Thermally hardenable compound B ("EBECRYL 3603" available from DAICEL-ALLNEX LTD.)

Thermally hardenable compound 1 (Bisphenol A type epoxy compound, "YL980" available from Mitsubishi Chemical Corporation)

Thermally hardenable compound 2 (Resorcinol type epoxy compound, "EX-201" available from Nagase ChemteX Corporation)

Thermally hardenable compound 3 (Epoxy resin, "EXA-4850-150" available from DIC Corporation)

(Hardener)

Thermal anionic hardener 1 ("HX-3722" available from Asahi Kasei Corp.)

Thermal anionic hardener 2 ("HX-3922" available from Asahi Kasei Corp.)

(Hardener Other than Anionic Hardener)

Thermal cationic hardener ("SI-60" available from SAN-SHIN CHEMICAL INDUSTRY CO., LTD.)

(Flux Containing Organic Acid A)

Flux 1 ((Reaction product prepared by allowing glutaric acid and methanol to react with each other in the presence of a tin catalyst) containing 85% by weight of glutaric acid, 5% by weight of monomethyl glutarate and 10% by weight of dimethyl glutarate, the esterification rate of 12.5%)

Flux 2 ((Reaction product prepared by allowing glutaric acid and methanol to react with each other in the presence of a tin catalyst) containing 50% by weight of glutaric acid, 35% by weight of monomethyl glutarate and 15% by weight of dimethyl glutarate, the esterification rate of 32.5%)

Flux 3 ((Reaction product prepared by allowing glutaric acid and methanol to react with each other in the presence of a tin catalyst) containing 10% by weight of glutaric acid, 20% by weight of monomethyl glutarate and 70% by weight of dimethyl glutarate, the esterification rate of 80%)

Flux 4 ((Reaction product prepared by allowing glutaric acid and methanol to react with each other in the presence of a tin catalyst) containing 5% by weight of glutaric acid, 10% by weight of monomethyl glutarate and 85% by weight of dimethyl glutarate, the esterification rate of 90%)

Flux 5 ((Reaction product prepared by allowing terephthalic acid and methanol to react with each other in the presence of a tin catalyst) containing 40% by weight of terephthalic acid, 30% by weight of monomethyl terephthalate and 30% by weight of dimethyl terephthalate, the esterification rate of 45%)

Flux 6 (100% by weight of monomethyl glutarate (isolated and purified product of the reaction product prepared by allowing glutaric acid and methanol to react with each other in the presence of a tin catalyst), the esterification rate of 50%)

Flux 7 ((Mixture prepared by mixing glutaric acid and monomethyl glutarate) containing 40% by weight of glutaric acid and 60% by weight of monomethyl glutarate, the esterification rate of 30%)

Flux 8 ((Mixture prepared by mixing monomethyl glutarate and dimethyl glutarate) containing 90% by weight of monomethyl glutarate and 10% by weight of dimethyl glutarate, the esterification rate of 50%)

(Esterified Substance B)

Dimethyl glutarate (Organic Acid C)

Glutaric acid (Conductive Particles)

Conductive particles A: conductive particles A having a metal layer in which a nickel plated layer is formed on the surface of divinylbenzene resin particles and a gold plated layer is formed on the surface of the nickel plated layer (average particle diameter of 15 μm)

Conductive particles B: conductive particles B in which a copper layer is formed on the surface of divinylbenzene resin particles and a solder layer is formed on the surface of the copper layer

[Preparation Method of Conductive Particles B]

Divinylbenzene resin particles ("Micropearl SP-210" available from SEKISUI CHEMICAL CO., LTD.) with an average particle diameter of 10 μm were subjected to electroless nickel plating to form an underlying nickel plated layer with a thickness of 0.1 μm on the surface of the resin particles. Then, the resin particles on the surface of which an underlying nickel plated layer was formed were subjected to electrolytic copper plating to form a copper layer with a thickness of 1 μm. Furthermore, using an electrolytic plating liquid containing tin and bismuth, electrolytic plating was performed to form a solder layer with a thickness of 1 μm. In this way, conductive particles B in which a copper layer with a thickness of 1 μm was formed on the surface of resin particles and a solder layer (tin:bismuth=43% by weight: 57% by weight) with a thickness of 1 μm was formed on the surface of the copper layer were prepared.

Conductive particles C: SnBi solder particles ("DS-10" available from MITSUI MINING & SMELTING CO., LTD., average particle diameter (median diameter) of 12 μm)

(Other Ingredients)

Adhesiveness imparting agent ("KBE-403" available from Shin-Etsu Chemical Co., Ltd.)

Examples 1 to 16 and Comparative Examples 1 to 5

The ingredients shown in the following Table 1 were blended in the blending amounts thereof shown in the following Tables 1 and 2 to obtain an anisotropic conductive paste.

(Preparation of Connected Structure)

A glass epoxy board (FR-4 substrate) having a copper electrode pattern (10 μm in copper electrode thickness) of L/S of 100 μm/100 μm on its upper face was prepared. Moreover, a flexible printed circuit board having a copper electrode pattern (10 μm in copper electrode thickness) of L/S of 100 μm/100 μm on its lower face was prepared.

On the upper face of the above-mentioned glass epoxy board, the obtained anisotropic conductive paste was coated so that the thickness becomes 30 μm to form an anisotropic conductive paste layer. Next, the anisotropic conductive paste layer was heated at 70° C. in order to allow the hardening thereof to proceed. Next, the above-mentioned flexible printed circuit board was layered on the upper face of the anisotropic conductive paste layer in which the hardening thereof had been allowed to proceed so that the two electrodes face each other. Afterward, a pressurizing/heating head was placed on the upper face of the flexible printed circuit board while the temperature of the head was adjusted so that the temperature of the anisotropic conductive paste layer becomes 185° C., a pressure of 2.0 MPa was applied thereto, and the anisotropic conductive paste layer was completely hardened at 185° C. to obtain a connected structure.

(Evaluation)

(1) Acid Value

In the obtained anisotropic conductive paste, to 100 mL of ethanol, 1 g of an organic acid and 1 drop of phenolphthalein were added and titrated with 1N-KOH to calculate an acid value.

(2) Reaction Rate

In the obtained anisotropic conductive paste, the exothermic peak temperature was measured with DSC for comparison.

(3) Fluxing Effect (Conduction Test)

The connection resistance between upper and lower electrodes in each of the obtained connected structures was measured by a four-terminal method. The mean value of the two connection resistance values was calculated. In this connection, from the relationship of Voltage=Current×Resistance, the connection resistance can be determined by measuring the voltage at the time of allowing a constant current to flow. The conduction test between upper and lower electrodes was evaluated according to the following criteria.

[Criteria for Conduction Test]

Double circle: The mean value of the connection resistance is less than or equal to 8.0Ω.

Circle: The mean value of the connection resistance is greater than 8.0Ω and less than or equal to 10.0Ω.

Triangle: The mean value of the connection resistance is greater than 10.0Ω and less than or equal to 15.0Ω.

X mark: The mean value of the connection resistance is greater than 15.0Ω.

(4) Adhesive Force

To a 3 cm×3 cm glass epoxy resin in the obtained connected structure, a polyimide resin with a thickness of 20 μm which was processed to the dimensions of 1 cm×4 cm was allowed to adhere in order to perform the measurement of the adhesive force.

The composition and the results are shown in the following Tables 1 and 2,

TABLE 1

| Formulation ingredients (parts by weight) | Ex. 1 | Ex. 2 | Ex. 3 | Ex. 4 | Ex. 5 | Ex. 6 | Ex. 7 | Ex. 8 | Ex. 9 | Ex. 10 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|---|---|---|
| Thermally hardenable compound A | 30 | | 35 | | 40 | | 25 | | 30 | | 50 | | 55 | | 60 |
| Thermally hardenable compound B | | 30 | | 35 | | 40 | | 25 | | 30 | | 50 | | 55 | |
| Thermally hardenable compound 1 | 47 | 47 | | | | | | | | | 37 | 37 | | | |
| Thermally hardenable compound 2 | | | 42 | 42 | | | 52 | 52 | 47 | 47 | | | 32 | 32 | |
| Thermally hardenable compound 3 | | | | | 37 | 37 | | | | | | | | | 27 |
| Thermal anionic hardener 1 | 8 | 8 | 8 | 8 | | | | | 8 | | | | | | |
| Thermal anionic hardener 2 | | | | | 8 | 8 | 8 | 8 | | 8 | | | | | |
| Thermal cationic hardener | | | | | | | | | | | 8 | 8 | 8 | 8 | 8 |
| Flux 1 | 3 | | | | | | 3 | | | | | | | | |
| Flux 2 | | 3 | | | | | | | | | | | | | |
| Flux 3 | | | 3 | | | | | | | 3 | | | | | |
| Flux 4 | | | | | | | | | | | | | | | |
| Flux 5 | | | | 3 | 3 | 3 | | 3 | 3 | | | | | | |
| Flux 6 | | | | | | | | | | | | | | | |
| Flux 7 | | | | | | | | | | | | | | | |
| Flux 8 | | | | | | | | | | | | | | | |
| Dimethyl glutarate | | | | | | | | | | | 3 | | 3 | | 3 |
| Glutaric acid | | | | | | | | | | | | 3 | | 3 | |
| Conductive particle A | 10 | 10 | | | | | 10 | 10 | | | | | | | |
| Conductive particle B | | | 10 | 10 | | | | | | | | | | | |
| Conductive particle C (solder particle) | | | | | 10 | 10 | | | 10 | 10 | 10 | 10 | 10 | 10 | 10 |
| Adhesiveness imparting agent | 2 | 2 | 2 | 2 | 2 | 2 | 2 | 2 | 2 | 2 | 2 | 2 | 2 | 2 | 2 |
| Evaluation | | | | | | | | | | | | | | | |
| Acid value (mgKOH/g) | 370 | 370 | 270 | 250 | 250 | 250 | 370 | 250 | 250 | 270 | 0 | 400 | 0 | 400 | 0 |
| Reaction rate (exothermic peak temperature (° C.)) | 136 | 137 | 118 | 116 | 120 | 122 | 134 | 126 | 126 | 123 | 95 | 92 | 97 | 92 | 96 |
| Fluxing effect (conduction test) | ○○ | ○○ | ○ | ○ | ○ | ○ | ○○ | ○ | ○ | ○ | x | x | x | x | x |
| Adhesive force (N) | 12 | 11 | 18 | 17 | 17 | 17 | 11 | 18 | 18 | 17 | 6 | 5 | 5 | 4 | 5 |

TABLE 2

| Formulation ingredients (parts by weight) | Ex.11 | Ex.12 | Ex.13 | Ex.14 | Ex.15 | Ex.16 |
|---|---|---|---|---|---|---|
| Thermally hardenable compound A | 40 | 40 | 40 | 40 | 40 | 40 |
| Thermally hardenable compound B | | | | | | |
| Thermally hardenable compound 1 | | | | | | |
| Thermally hardenable compound 2 | | | | | | |
| Thermally hardenable compound 3 | 37 | 37 | 37 | 37 | 37 | 37 |
| Thermal anionic hardener 1 | | | | | | |
| Thermal anionic hardener 2 | 8 | 8 | 8 | 8 | 8 | 8 |
| Thermal cationic hardener | | | | | | |
| Flux 1 | | | | | | |
| Flux 2 | | | | | | |
| Flux 3 | | | | | | |
| Flux 4 | | 1 | | | | |
| Flux 5 | 0.5 | | | | 3 | |
| Flux 6 | | | 3 | | | |
| Flux 7 | | | | 3 | | |
| Flux 8 | | | | | | 3 |
| Dimethyl glutarate | | | | | | |
| Glutaric acid | | | | | | |
| Conductive particle A | | | | | | |
| Conductive particle B | | | | | | |
| Conductive particle C (solder particle) | 10 | 10 | 10 | 10 | 10 | 10 |
| Adhesiveness imparting agent | 2 | 2 | 2 | 2 | 2 | 2 |
| Evaluation | | | | | | |
| Acid value (mgKOH/g) | 50 | 190 | 310 | 190 | 310 | 250 |
| Reaction rate (exothermic peak temperature (° C.)) | 120 | 120 | 120 | 120 | 120 | 120 |
| Fluxing effect (conduction test) | ○ | ○ | ○ | ○ | ○ | ○ |
| Adhesive force (N) | 17 | 17 | 17 | 17 | 17 | 13 |

EXPLANATION OF SYMBOLS

1 . . . Conductive particle
1a . . . Surface
2 . . . Resin particle
2a . . . Surface
3 . . . Conductive layer
4 . . . First conductive layer
4a . . . Surface
5 . . . Solder layer
5a . . . Melted portion of solder layer
11 . . . Conductive particle
12 . . . Solder layer
16 . . . Solder particle
21 . . . Connected structure
22 . . . First connection object member
22a . . . Surface
22b . . . First electrode
23 . . . Second connection object member
23a . . . Surface
23b . . . Second electrode
24 . . . Connection part

The invention claimed is:

1. A conductive material, comprising conductive particles having solder at at least an external surface, an anionically hardenable compound, an anionic hardener, and an organic acid having a carboxyl group and having a functional group that is an esterified carboxyl group.

2. The conductive material according to claim 1, wherein the organic acid having a carboxyl group and having a functional group that is an esterified carboxyl group is obtained by esterifying a part of carboxyl groups in an organic acid having a plurality of carboxyl groups.

3. The conductive material according to claim 1, wherein the organic acid having a carboxyl group and having a functional group that is an esterified carboxyl group is obtained by allowing an organic acid having a plurality of carboxyl groups and an alcohol to react with each other so that a part of carboxyl groups is esterified.

4. The conductive material according to claim 1, further comprising an esterified substance obtained by esterifying all of carboxyl groups in an organic acid having a plurality of carboxyl groups.

5. The conductive material according to claim 1, further comprising an organic acid having a plurality of carboxyl groups but having no functional group that is an esterified carboxyl group.

6. The conductive material according to claim 1, further comprising an esterified substance obtained by esterifying all of carboxyl groups in an organic acid having a plurality of carboxyl groups, and an organic acid having a plurality of carboxyl groups but having no functional group that is an esterified carboxyl group.

7. The conductive material according to claim 6, wherein the proportion of the functional group that is an esterified carboxyl group is greater than or equal to 10% and less than or equal to 80%, relative to 100% of the whole number of carboxyl groups and functional groups that are esterified carboxyl groups, in the total of the organic acid having a carboxyl group and having a functional group that is an esterified carboxyl group, the esterified substance obtained by esterifying all of carboxyl groups in an organic acid having a plurality of carboxyl groups, and the organic acid having a plurality of carboxyl groups but having no functional group that is an esterified carboxyl group.

8. The conductive material according to claim 1, wherein an acid value is greater than or equal to 50 mgKOH/g and less than or equal to 370 mgKOH/g.

9. The conductive material according to claim 1, wherein the organic acid having a carboxyl group and having a functional group that is an esterified carboxyl group has one carboxyl group.

10. The conductive material according to claim 1, being a circuit connecting, material used for the electrical connection between electrodes.

11. A connected structure, comprising a first connection object member having a first electrode on its surface, a second connection object member having a second electrode on its surface, and a connection part connecting the first connection object member and the second connection object member, wherein the connection part is formed of the conductive material according to claim 1, and the first electrode and the second electrode are electrically connected by the conductive particle.

* * * * *